United States Patent [19]

Beasom

[11] Patent Number: 4,546,539

[45] Date of Patent: Oct. 15, 1985

[54] I²L STRUCTURE AND FABRICATION PROCESS COMPATIBLE WITH HIGH VOLTAGE BIPOLAR TRANSISTORS

[75] Inventor: James D. Beasom, Melbourne, Fla.

[73] Assignee: Harris Corporation, Melbourne, Fla.

[21] Appl. No.: 447,946

[22] Filed: Dec. 8, 1982

[51] Int. Cl.⁴ .................. H01L 21/72; H01L 21/82
[52] U.S. Cl. ..................... 29/577 C; 29/576 E;
29/578; 148/175; 148/187; 148/DIG. 85;
148/DIG. 87; 148/DIG. 151; 357/44; 357/46;
357/52; 357/92
[58] Field of Search ............. 148/175, 187; 29/576 E,
29/577 C, 578; 357/44, 46, 52, 92

[56] References Cited

U.S. PATENT DOCUMENTS

| 3,865,649 | 2/1975 | Beasom | 148/175 X |
|---|---|---|---|
| 4,075,039 | 2/1978 | Sloan, Jr. | 148/1.5 |
| 4,087,900 | 5/1978 | Yiannoulos | 29/578 |
| 4,110,126 | 4/1978 | Bergeron et al. | 148/1.5 |
| 4,137,109 | 1/1979 | Aiken et al. | 148/175 |
| 4,149,906 | 4/1979 | De Al Moneda | 148/1.5 |
| 4,197,147 | 4/1980 | Bergmann et al. | 148/175 |
| 4,228,448 | 10/1980 | Lalumia et al. | 357/92 X |
| 4,255,209 | 3/1981 | Morcom et al. | 148/187 X |
| 4,258,379 | 3/1981 | Watanabe et al. | 357/44 |
| 4,326,212 | 4/1982 | Bergeron et al. | 357/46 |
| 4,404,738 | 9/1983 | Sasaki et al. | 29/577 C |
| 4,999,775 | 4/1980 | Agraz-Guerena et al. | 357/46 |

FOREIGN PATENT DOCUMENTS

| EP-54303 | 6/1982 | European Pat. Off. | 357/92 |
|---|---|---|---|
| 2835330 | 2/1980 | Fed. Rep. of Germany | 357/92 |
| 53-38990 | 4/1978 | Japan | 357/92 |
| 56-142661 | 11/1981 | Japan | 357/92 |

OTHER PUBLICATIONS

Tokumaru et al., "I²L with Self-Aligned Double-Diffused Injector" IEEE J. Solid-State Circuits, vol. SC-12, No. 2, (Apr. 1977), pp. 109-114.

Primary Examiner—William G. Saba
Attorney, Agent, or Firm—Barnes & Thornburg

[57] ABSTRACT

An integrated circuit wherein the base and surface collector regions of the I²L vertical transistor are formed by the same steps used to form the collector and base, respectively, of complementary bipolar transistors. Thus, a high voltage bipolar transistor of the same type as the vertical I²L transistor may be formed using separate process steps, thereby optimizing the design of both devices.

13 Claims, 6 Drawing Figures

I²L STRUCTURE AND FABRICATION PROCESS COMPATIBLE WITH HIGH VOLTAGE BIPOLAR TRANSISTORS

BACKGROUND OF THE INVENTION

The present invention relates generally to integrated injection logic (I²L) and more specifically to an I²L structure which is compatible with high voltage bipolar transistors.

I²L is a well known bipolar logic form which has high packing density, can be realized in a single isolated island, is operable from a low supply voltage and affords low power dissipation. These characteristics make it attractive as a compatible logic in bipolar linear processes. The fact that it can be built in a single island is particularly attractive in high voltage processes because the isolation methods for high voltage IC's require much area and yield large minimum islands. Thus a single island logic saves much area compared to alternative multiple island approaches.

A well known limitation to the application of I²L in high voltage-processes is the large hole storage in the N− portion of the emitter of the inverted NPN which forms the gate of the I²L structure. High voltage NPN's require thick, high resistivity N− collector regions to achieve high $BV_{CBO}$ and $BV_{CEO}$. In addition to the high hole storage in this region of the I²L transistor emitter mentioned above which increases propagation delay, the I²L NPN emitter efficiency is so lowered that.the gate will not function.

In prior art integrated circuits including I²L structure and bipolar transistors, the process step to form the base of the NPN bipolar transistor is used also to form the base of the NPN inverted transistor of the I²L. This results in a large N− emitter portion of the I²L NPN. Solution to this problem using the aforementioned process is to provide a buried layer of the same conductivity type as the base of the NPN of the I²L formed by outdiffusion into the epitaxial layer. This is specifically described in U.S. Pat. No. 4,255,209 to Morcom et al. Since the buried P portion is directly on top of the buried N+ region, the N− emitter region for the inverted NPN of I²L has been eliminated. Although this process is satisfactory for low voltage bipolar transistors, as discussed above it is not applicable to high voltage NPN transistors.

Another method of removing the buried N− emitter region is to provide multiple resistivity and multiple buried layers at different depths. An example of the multiple buried layers is described in U.S. Pat. No. 4,087,900 to Yiannoulos. In this patent, an intricate process is used to form the multiple buried layers. The device is structured within the epitaxial layer in the base region of the I²L inverted transistor so that the modification of the buried layer is a modification of the buried emitter instead of modification of the base region.

Thus there exists a need for a simple method of fabricating improved I²L devices in integrated circuits with high voltage bipolar transistors.

SUMMARY OF THE INVENTION

An object of the present invention is to provide a simple method for manufacturing I²L devices in an integrated circuit with high voltage bipolar transistors.

Another object of the present invention is to fabricate I²L devices in an integrated circuit using the process steps which are used to form the high voltage bipolar transistors in the same integrated circuit.

Still a further object of the present invention is to produce an improved I²L structure formed in an integrated circuit with high voltage bipolar transistors.

These and other objects of the invention are attained by forming the base of the I²L device using the collector diffusion of the bipolar device in a low impurity substrate of opposite conductivity type and forming the collector region of the I²L device using the base diffusion step of the bipolar transistor. The emitter diffusion of bipolar transistor is used to form base contacts and an injector in the I²L device. A shield region separating the injector from the substrate in the I²L device is formed during the collector region formation of the I²L device and in one embodiment may extend from the substrate laterally into the base region of the I²L. The base contact diffusion in the bipolar transistor is also used to form collector contact regions in the I²L device. Preferrably the base diffusion in the I²L extends from the surface of the substrate down to the buried layer of the same conductivity type as the substrate region. The deposition and diffusion step used to form the bipolar collector region and the I²L base region may be performed from the topside of the substrate or from the backside. The base contact region and the injector region of the I²L may alternatively be formed using the base diffusion step of a bipolar transistor complementary to the first bipolar transistor.

Using the collector diffusion step and the base diffusion step of the bipolar transistor to form the base and surface collector of the I²L device improves the characteristics of the I²L device and allows a formation of a bipolar transistor complementary to the bipolar transistor formed simultaneously with the I²L device and having a higher breakdown voltage. Thus the complementary bipolar transistor may be fabricated and designed to meet different requirements than the I²L device as in the prior art.

DESCRIPTION OF PREFERRED EMBODIMENTS

Figure 1:
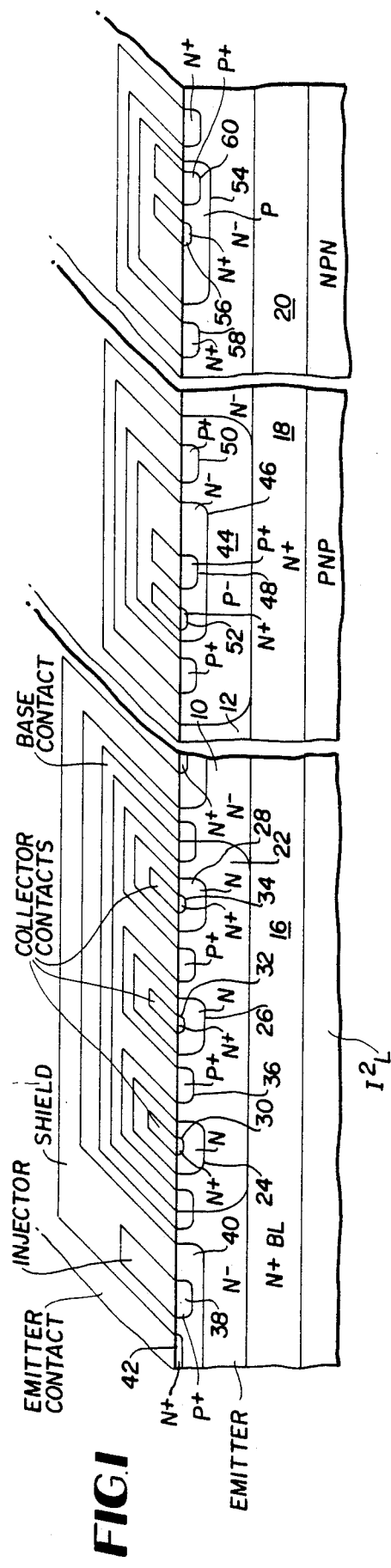
FIG. 1 is a cross-sectional perspective view of an integrated circuit incorporating the I²L and high voltage bipolar transistors of the present invention.

An integrated circuit as illustrated in FIG. 1 includes an I²L device and a pair of complementary bipolar transistors. The I²L device is built in an N− substrate region 10, the PNP device is built in a N− substrate region 12 and the NPN transistor is built in the N− substrate region 14. Each of the substrates include a buried N+ layer 16, 18 and 20 respectively. The substrate regions 10, 12 and 14 and their buried regions 16, 18 and 20 are in separate isolated regions. The isolation may be dielectric isolation along the lateral edges and the bottom of the N+ buried layer or junction isolation along the lateral edges and bottom of the buried layer or a combination thereof. The buried region 16 may be selectively provided and buried region 18 may be deleted.

Generally the N− regions 10, 12 and 14 are all part of the same substrate or layer depending upon the isolation technique to be used. Since the integrated circuit is designed for high voltage bipolar transistors, the substrates 10, 12 and 14 has a depth of at least 10 microns and a bulk resistance of 3 to 5 ohms-centimeters and the buried regions 16, 18 and 20 have a sheet resistance of approximately 15 ohms per square.

The I$^2$L device includes a P base region 22 in the N− substrate 10 extending from the surface down to the buried region 16. As will be explained more fully below, it is important that the P region 22 extends substantially down to but not necessarily touching the buried layer 16 to minimize or eliminate the N− emitter region and have a depth of at least 8 microns. The surface impurity concentration of the base region 22 may be, for example, $1.0 \times 10^{16}$ atoms per cubic centimeter. N type collector regions 24, 26 and 28 are formed in the P base region 22 and have N+ collector contact regions 30, 32 and 34 formed, respectively, therein. The collector regions 24, 26 and 28 may have a depth of, for example, 5 microns and an surface impurity concentration of $1 \times 10^{18}$ atoms per cubic centimeter and the N+ contact regions may have surface impurity concentration of $5 \times 10^{20}$ atoms per cubic centimeter. A P+ contact region 36 is formed along the surface junction of the P base region 22 and the substrate N and between the collector regions 24, 26 and 28. The P+ base contact regions may have a surface impurity concentration of $1 \times 10^{20}$ atoms per cubic centimeter.

A P+ injector region 38 is formed in a N guard region 40 which separates the injector 38 from the substrate region 10. The shield region 40 has the same depth and impurity concentration as the collection regions 24, 26 and 28 and the injector region 38 has the same depth and impurity concentration as the base contact region 36. An N+ surface emitter contact region 42 is formed in the shield region 40 having the same depth and impurity concentration as the collector contact regions 30, 32 and 34.

The PNP bipolar transistor formed in N− isolated substrate region 12 includes a P collector region 44, an N base region 46 and a P+ emitter region 48. P+ collector contact region 50 is formed in the collector 44 and N+ base contact region 52 is formed in the base region 46. The P collector region 44 of the PNP bipolar transistor has the same depth and impurity concentration as the P base region 22 of the I$^2$L. Bipolar base region 46 has the same depth and impurity concentration as collector regions 24, 26 and 28 of the I$^2$L and P+ emitter region 48 of the bipolar transistor has the same impurity concentration and depth as the injector 38 and the base contact region 36 of the I$^2$L device. Similarily the P+ collector contact region 50 and the N+ base contact region 52 of the PNP bipolar transistor have the same depth and impurity concentration as the injector 38 and the collector contacts 30, 32 and 34 of the I$^2$L device respectively.

The high voltage NPN transistor formed in isolated substrate region 14, which forms the collector of the NPN transistor, also includes a P base region 54, an N+ emitter 56, N+ collector contact region 58 and P+ base contact region 60. The P base region 54 has a surface impurity concentration of $1 \times 10^{19}$ atoms per cubic centimeter and a depth in the range of 2 to 4 microns. The N+ emitter region 56 and collector contact region 58 have the same impurity concentration and depth as the N+ base contact region 52 of the PNP biopolar transistor. The P+ base contact region 60 has the same depth and impurity concentration as the P+ emitter 48 of the PNP bipolar transistor.

The use of a low impurity concentration substrate 10, 12 and 14 is necessary for the high voltage NPN transistor and is detrimental to the performance of the I$^2$L device. An analysis of the three devices in FIG. 1 will indicate that the depth and impurity concentration of the P base region 54 of the high voltage NPN transistor is different and distinct from the P base region 22 of the I$^2$L device. This allows a large base to buried layer spacing for the high voltage NPN transistor which is required for the high voltage operation while allowing the base to buried emitter region of the I$^2$L device to be minimized. As discussed above, this reduces the amount of N− region under the base in the I$^2$L device in which hole storage occurs and improves emitter efficiency. Also, the collector regions 24, 26, 28 of the I$^2$L have a greater depth than the emitter region 56 of the high voltage NPN transistor which reduces the base width of the I$^2$L thereby reducing the base transit time and electron storage in the base.

The shield region 40 of the I$^2$L prevents the inversion of the surface of the low impurity concentration substrate 10 from reaching the injector 38 for normal operating voltages without substantially increasing the spacing of the injector from the base region 22.

Although the integrated circuit in FIG. 1 illustrates a I$^2$L having an NPN bipolar vertical transistor with a PNP injector and a high voltage NPN transistor the conductivity type of the specific areas may be reversed resulting in a high voltage PNP bipolar transisitor and an I$^2$L structure having a PNP vertical transistor and an NPN lateral injector.

Figure 2:
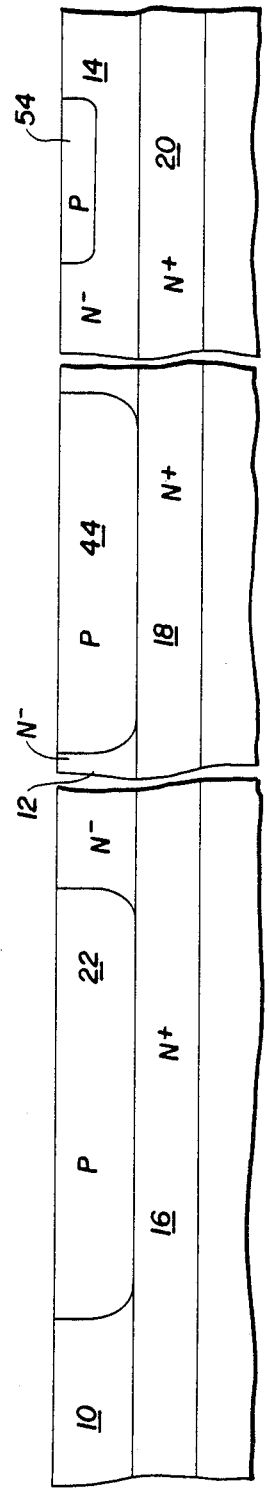
FIGS. 2 and 3 illustrate a cross-sectional view of an integrated circuit at different stages of fabrication of the devices of FIG. 1.

The process for fabricating the integrated circuit of FIG. 1 begins with introducing P type impurities, for example, boron, into isolated substrate regions 10 and 12 and diffusion to form the P base region 22 and the P collector region 44 respectively. As discussed above, the isolated N− regions 10, 12 and 14 may be junctioned or dielectrically isolated or a combination thereof and include the buried layer 16, 18 and 20 respectively. The P type impurities may be introduced by deposition or ion implantation through a masking layer (not shown) and diffused for example for 24 hours to diffuse to the buried N+ layers 16, 18 and 20 for an N− substrate region 10, 12 and 14 of a thickness of 15 microns. Preferably the P base region 22 and the P collector region 44 are diffused down to the buried layers 16 and 18 although a depth less than the buried layer 16, 18 is acceptable depending upon the speed required and emitter efficiency. The introduction of impurities may be by deposition of ion implantation followed by subsequent diffusion. The resulting structure at this point in the process is illustrated in FIG. 2.

Figure 3:
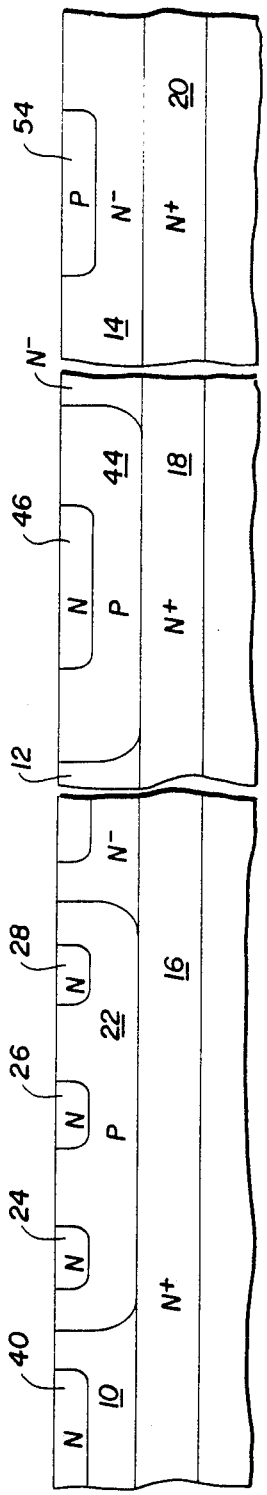

Another masking step is performed and N type impurities, for example, phosphorous, are introduced through the mask to form collector regions 24, 26 and 28 in the base region 22, the shield region 40 in N− substrate 10, and the base region 46 in collector region 44. The impurities introduced by ion implantation or deposition is followed by subsequent diffusion. Next, P type impurities, for example, boron, are introduced through a mask into N− substrate region 10 to form base region 54. The substrate at this point of fabrication is illustrated in FIG. 3.

Next, the masking step is performed and P type impurities, for example, boron, are introduced to form injector region 38 in shield region 40, P+ base contact region 36 in base region 22, emitter region 48 in base region 46, collector contact region 50 in collector 44 and base contact region 60 in base region 54. Next, another masking step is performed and N type impurities, for example, phosphorous, are introduced to form emitter contact region 42 in shield region 40, collector contact regions 30, 32 and 34 in collector regions 24, 26 and 28, respectively, base contact region 52 in base region 46, emitter region 56 in base region 54 and collector region 58 in collector region 14. Isolation layers are provided on the substrate and apertures formed therein to provide contacts to the appropriate regions.

Since the formation of masks on the substrate is well known, specific details of these steps are not contained herein. Similarly, it is well known that if total junction isolation is used or if junction isolation is used only below the N+ buried regions 16, 18 and 20, the substrate regions 10, 12 and 14 and the buried regions 16, 18 and 20 may be formed by forming an N+ region in a P type substrate followed by the epitaxial deposition of the N− substrate or layers 10, 12 and 14. The N+ region is usually formed by deposition and out diffusion of impurities during the epitaxial growth of the N− regions 10, 12 and 14. The lateral edges may be junctioned or dielectrically isolated as is well known in the art.

Figure 4:
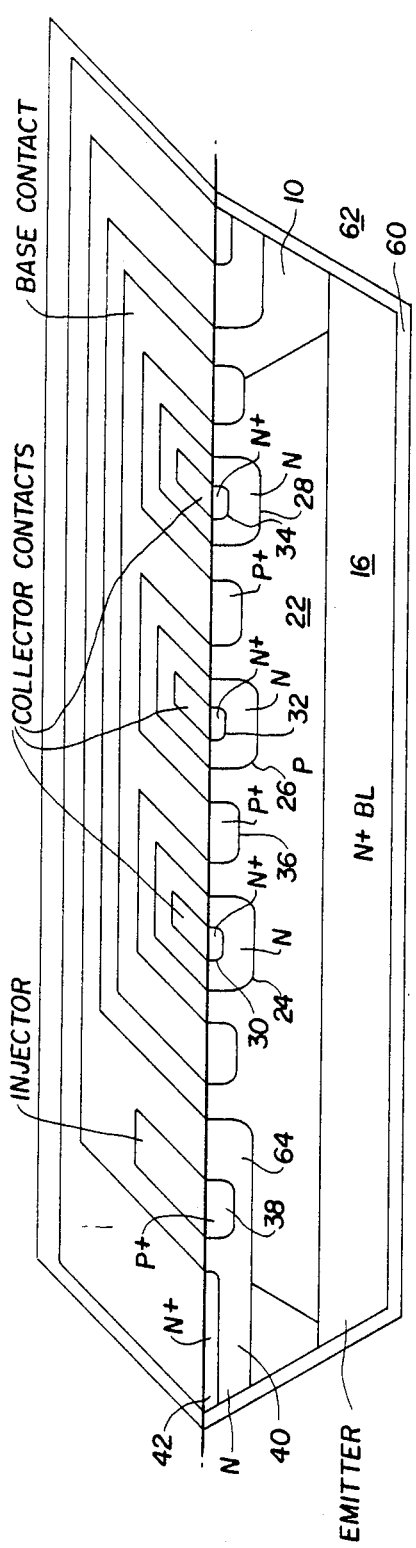
FIG. 4 is a cross-sectional perspective view of another embodiment of an I²L device incorporating the principles of the present invention.

Another embodiment of the present invention is illustrated in FIG. 4. The I²L device in FIG. 4 is formed in a dielectrically isolated tub having dielectrically isolated layer 60 and a polycrystalline support 62. The P base region 22 is formed from the backside of the substrate and extends to the surface. This is true not only for the P base region 22 but the collection 44 of the PNP transistor of FIG. 1 which is not illustrated in FIG. 4. The process for forming the dielectric isolations 60 and the P base region 22 is described in detail in U.S. Pat. No. 3,865,649 to Beasom which is incorporated herein by reference. As described, this process includes introducing P type impurities along the backside in the desired areas where the base region 22 and the collect region 44 is to be formed. This is followed by deposition and diffusion of impurities to form the N+ buried region 16. The dielectric isolation is formed using a standard process of etching, coating the etched surface with an insulative layer 52, depositing the polycrystalline support 62 and lapping back the N− substrate to form the dielectric isolated regions 10, 12 and 14. This back diffused process eliminates all the N− regions between the P region 22 and the buried region 16 and also provides a favorable electric field in the I²L base region which improves AC performance.

Another modification of the I²L device in FIG. 4 which may be incorporated into FIG. 1 with or without the dielectric isolation and the back diffusion is the formation of the shield region 40 to extend from the N− region 10 into the P base region 22. The P+ injector 38 is formed in the extended region 64 of the shield region 40 that lies within P base region 22. This results in a vertical PNP transistor as the injector verses the lateral PNP of FIG. 1. The vertical PNP of the I²L FIG. 4 has a higher current gain which reduces power dissipation.

Figure 5:
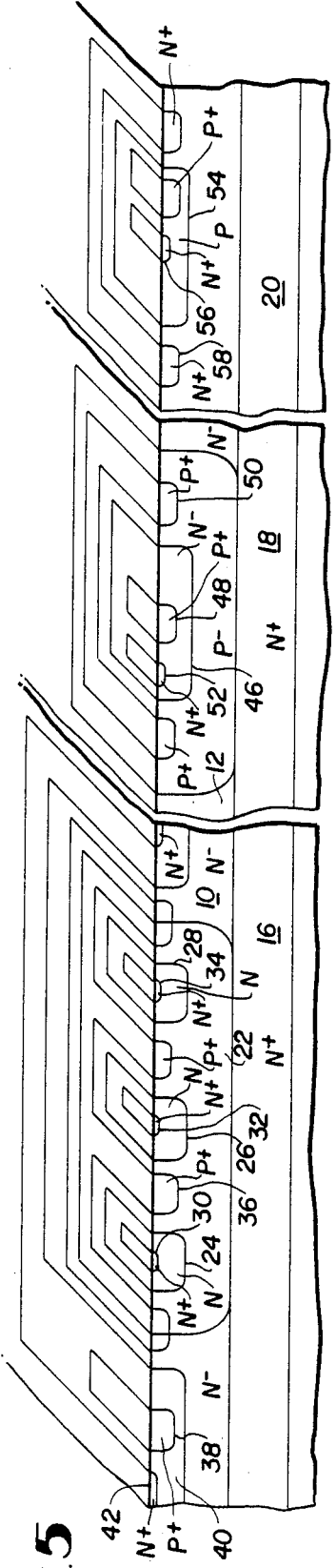
FIG. 5 is a cross-sectional perspective view of another embodiment of an I²L and high voltage bipolar transistors incorporating the principles of the present invention.

Another modification to the integrated circuit of FIG. 1 is illustrated in FIG. 5. The injector 38 and the base contact 24 of the I²L are the same depth and impurity concentration as the base region 54 of the high voltage NPN transistor and are formed simultaneously. In FIG. 1, the injector 38 and base contact 36 of the I²L are formed simultaneously within the emitter 48 of the PNP bipolar transistor.

Figure 6:
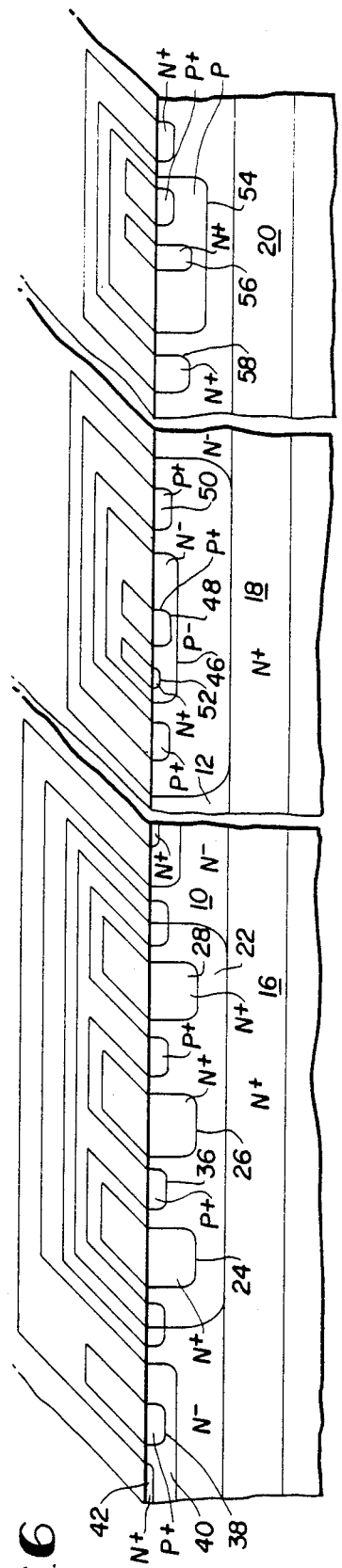
FIG. 6 is a cross-sectional perspective view of another embodiment of an I²L and high voltage bipolar transistors incorporating the principles of the present invention.

In certain circuit designs, the N base of a shallow PNP may be shallower than an N+ emitter for an NPN. For this situation, the deeper N+ emitter diffusion should be used to form the collectors 24, 26, 28 in the I²L inverted transistor since it will yield a shorter base width. This would eliminate the need for collector contacts 30, 32, 34. This is illustrated in FIG. 6.

It is evident from the detailed description of the present invention, that the objects of the invention are attained in that an improved method of fabricating I²L devices in an integrated circuit with high voltage bipolar transistors is provided. Although the invention has been described and illustrated in detail, it is to be clearly understood that the same is by way of example and illustration only and is not to be taken by way of limitation. The spirit and scope of the present invention are to be limited only by the terms of the appended claims.

What is claimed is:

1. A method of fabricating vertical bipolar transistors and an integrated injection logic device simultaneously comprising:

introducing and diffusing impurities of a first conductivity type into a first and second isolated substrate region of a second conductivity type opposite said first conductivity type to form a collector region of said vertical bipolar transistor in said first substrate region and a base region of said logic in said second substrate region;

introducing impurities of said second conductivity type into said vertical bipolar collector region to form a base region, and into said logic base region to form a collector region;

introducing impurities of said first conductivity type into said second substrate region to form an injector region;

introducing impurities of said first conductivity type into said vertical bipolar base region to form an emitter region;

introducing impurities of said second conductivity type into said vertical bipolar base region to form a base contact region, into said logic collector region to form a collector contact region, and into said second substrate region to form a logic emitter contact region.

2. The method of claim 1 including introducing impurities of said second conductivity type in said second substrate region to form a shield region for said logic simultaneously with the formulation of said logic collector region and wherein said injector region is formed in said shield region to have depth less than said shield region.

3. The method of claim 2 wherein said shield region is formed to extend into said logic base region and said injector region is formed in a portion of said shield region which extends into said logic base region.

4. The method of claim 1 when introducing said first conductivity type impurities to form said injector region and said vertical bipolar emitter region are performed simultaneously.

5. The method of claim 1 including introducing first conductivity type impurities into said logic base region to form a logic base contact region.

6. The method of claim 1 wherein said logic base region is formed to extend from the surface of said substrate to a buried layer of said second conductivity type in said second substrate region.

7. The method of claim 6 wherein said introduction and diffusion of first conductiveity type impurities is introduced through the back surface of said substrate before the formation of said buried layer followed by forming said buried layer by introducing impurities into said back surface, dividing said substrate into wells and applying a dielectric layer on said back surface, and continuing said process by introducing impurities through said top surface.

8. The method of claim 1 wherein said first conductivity impurities are diffused to form said vertical bipolar collector region and said logic base region to a depth of at least 8microns.

9. The method of claim 8 wherein said second conductivity type impurities are diffused to form said vertical bipolar base region and said logic collector region to a depth of at least 2.5 microns.

10. The method according to claim 1 including:
introducing first conductivity type impurities into a third isolated substrate region to form a base region of a second vertical bipolar transistor after the formation of said logic base region; and
introducing second conductivity type impurities into said third substrate region and said second vertical bipolar base region to form a collector contact region and an emitter region respectively of said second vertical bipolar transistor simultaneously with the formation of said logic collector contact region.

11. The method according to claim 1 including:
introducing first conductivity type impurities into a third isolated substrate region to form a base region of a second bipolar transistor simultaneously with the formulation of said logic injector region; and
introducing second conductivity type impurities into said third substrate region and said second bipolar base region to form a collector contact region and an emitter region respectively of said second bipolar transistor simultaneously with the formulation of said logic collector contact region.

12. A method of fabricating complementary vertical bipolar transistors and an integrated injection logic device simultaneously comprising:
introducing and diffusing impurities of a first conductivity type into a first and second isolated substrate region of a second conductivity type opposite said first conductivity type to form a collector region of a first vertical bipolar transistor in said first substrate region and a base region of an integrated injection logic device in said second substrate region;
introducing and diffusing impurities of said second conductivity type into said second isolated substrate region to form a buried layer;
introducing impuities of said first conductivity type into a third isolated substrate region to form a base region of a second vertical bipolar transistor complementary to said first vertical bipolar transistor;
introducing impurities of said second conductivity type into said logic base region to form a collector region and into said second vertical bipolar base region to form an emitter region;
introducing impuities of said second conductivity type into said first vertical bipolar collector region to form a base region;
introducing impurities of said first conductivity type into said second substrate region to form an injector region; and
introducing impurities of said first conductivity type into said first vertical bipolar base region to form an emitter region.

13. The method of claim 12 wherein said introduction and diffusion of first conductivity type impurities is introduced through the bace surface of said substrate before the formation of said buried layer followed by forming said buried layer by introducing impurities into said back surface, dividing said said substrate into wells and applying a dielectric layer on the sand back surface, and continuing said process by introducing impurities through said top surface.

* * * * *